(12) United States Patent
Brunschwiler et al.

(10) Patent No.: US 7,872,867 B2
(45) Date of Patent: Jan. 18, 2011

(54) COOLING SYSTEM FOR AN ELECTRONIC COMPONENT SYSTEM CABINET

(75) Inventors: Thomas Brunschwiler, Thalwil (CH); Ryan J. Linderman, Pasadena, CA (US); Hugo E. Rothuizen, Adliswil (CH); Reto Waelchli, Zuerich (CH)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/202,619

(22) Filed: Sep. 2, 2008

(65) Prior Publication Data

US 2010/0053890 A1   Mar. 4, 2010

(51) Int. Cl.
*H05K 7/20* (2006.01)
(52) U.S. Cl. ............... 361/699; 361/724; 174/15.1; 165/80.4; 165/80.5; 165/104.33; 257/714
(58) Field of Classification Search ........... 361/724, 361/699, 679.53, 690, 695, 697, 702–706, 361/709, 712, 714, 717, 718, 719, 722, 679.46, 361/679.47, 679.48, 679.5; 165/80.4, 104.33; 257/712, 713, 717, 718, 719, 722; 174/16.3
See application file for complete search history.

(56) References Cited

U.S. PATENT DOCUMENTS

| | | | |
|---|---|---|---|
| 4,999,741 A * | 3/1991 | Tyler | .......... 361/705 |
| 7,244,889 B2 | 7/2007 | Fanuef et al. | |
| 2002/0100579 A1 | 8/2002 | Heikkila et al. | |
| 2004/0182551 A1 | 9/2004 | Zhou et al. | |
| 2005/0083657 A1* | 4/2005 | Hamman | .......... 361/699 |
| 2005/0241799 A1 | 11/2005 | Malone et al. | |
| 2005/0243519 A1* | 11/2005 | Weber et al. | .......... 361/699 |
| 2006/0053814 A1 | 3/2006 | Naik et al. | |
| 2007/0017659 A1 | 1/2007 | Brunschwiler et al. | |
| 2007/0199339 A1 | 8/2007 | Ishihara et al. | |
| 2007/0201210 A1 | 8/2007 | Chow et al. | |

OTHER PUBLICATIONS

International Search Report; International Application No. PCT/US2009/054422; International Filing Date: Aug. 20, 2009.
Written Opinion; International Application No. PCT/US2009/054422; International Filing Date: Aug. 20, 2009.

* cited by examiner

*Primary Examiner*—Zachary M Pape
*Assistant Examiner*—Jerry Wu
(74) *Attorney, Agent, or Firm*—Cantor Colburn LLP; Stephen Kaufman

(57) ABSTRACT

An electronic component system cabinet includes a plurality of electronic component system bays, and a plurality of electronic component systems mounted in respective ones of the plurality of electronic component system bays. The electronic component system cabinet further includes a cooling system including a plurality of coolant reservoirs. Each of the plurality of coolant reservoirs is associated with at least one of the plurality of electronic component system bays. The cooling system further includes at least one pump fluidly connected to each of the plurality of coolant reservoirs. The at least one pump is selectively operated to circulate a supply of coolant to each of the plurality of coolant reservoirs.

10 Claims, 7 Drawing Sheets

COOLING SYSTEM FOR AN ELECTRONIC COMPONENT SYSTEM CABINET

BACKGROUND

This invention relates to the art of cooling systems and, more particularly, to a cooling system for an electronic component system cabinet.

Conventional air cooling systems are inefficient and limit integration density of information technology (IT) equipment in server racks. Air cooling inefficiency leads to high infrastructure and energy costs. In order to provide greater cooling efficiency many IT systems currently employ liquid cooling systems. Liquid cooling systems are typically more compact relative to similarly rated air cooling systems. In addition, liquid cooling systems generally have lower power requirements than similarly rated air cooling systems due to the improved thermo-physical properties of liquids as compared to air.

While effective, liquid cooling systems possess several drawbacks. For example, reliable implementation of liquid cooling systems in highly parallel and flexible systems such as, blade servers is challenging. When using liquid as a coolant, each blade server includes a corresponding blade liquid loop that must connect with an associated rack liquid loop. In order to maintain system flexibility, individual blade servers must be readily interchangeable during operation. Thus, each blade server typically includes an associated pump or pumps and a quick-connect member that fluidly links the blade liquid loop to the rack liquid loop. Quick-connects represent a potential failure point that may result in fluid contacting electronic components on the blade server. In addition, the use of multiple pumps for redundancy purposes significantly increases system costs. Liquid contact, of any amount, with electronic components is unacceptable. A faulty quick connect could result in a significant liquid leakage. Quick connects also do not prevent the gradual loss of liquid over time requiring liquid reservoirs to be refilled.

SUMMARY

In accordance with an exemplary embodiment of the invention, an electronic component system cabinet includes a housing having a plurality of electronic component system bays, and an electronic component system mounted in one of the plurality of electronic component system bays. The electronic component system includes at least one heat producing component and a cooling system operatively connected to the at least one heat producing component. The cooling system includes a spreader plate having a first surface arranged in a heat exchange relationship with the at least one heat producing component and a second surface including a flexible membrane portion. The spreader plate also includes a fluid. The system cabinet also includes a cabinet cooling system having at least one coolant reservoir containing a coolant. The at least one coolant reservoir includes a flexible membrane arranged in non-fluid contact with the flexible membrane portion of the spreader plate. The cooling system also includes a centralized pumping system having at least one pump fluidly connected to the at least one coolant reservoir. The at least one pump is selectively operated to circulate a flow of coolant to the at least one coolant reservoir, the coolant flow expanding and contracting the flexible membrane causing the fluid to flow within the spreader plate to absorb heat produced by the at least one heat producing component.

In accordance with another exemplary embodiment of the invention, cooling an electronic component system cabinet including a housing having a plurality of electronic component system bays, and a plurality of electronic component systems mounted in respective ones of the plurality of electronic component system bays, includes pumping coolant through a coolant loop via a central pumping system into at least one coolant reservoir. The at least one coolant reservoir is arranged at one of the plurality of electronic component system bays and in non-fluid contact with one of the plurality of electronic component systems. A flexible membrane of the coolant reservoir is expanded and contracted into contact with a flexible membrane portion of a spreader plate of the electronic component system. Fluid within the spreader plate is circulated, heat from a heat producing component is extracted into the fluid within the spreader plate of the electronic component, and the heat is removed from the fluid.

In accordance with yet another exemplary embodiment of the invention, a cooling system for an electronic component system cabinet having a plurality of electronic component system bays includes at least one coolant reservoir containing a coolant. The at least one coolant reservoir includes a flexible membrane. The cooling system further includes a centralized pumping system including at least one pump fluidly connected to the at least one coolant reservoir. The at least one pump is selectively operated to circulate a flow of coolant to the at least one coolant reservoir. The flow of coolant expands and contracts the flexible membrane.

Additional features and advantages are realized through the techniques of exemplary embodiments of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION

Figure 1:
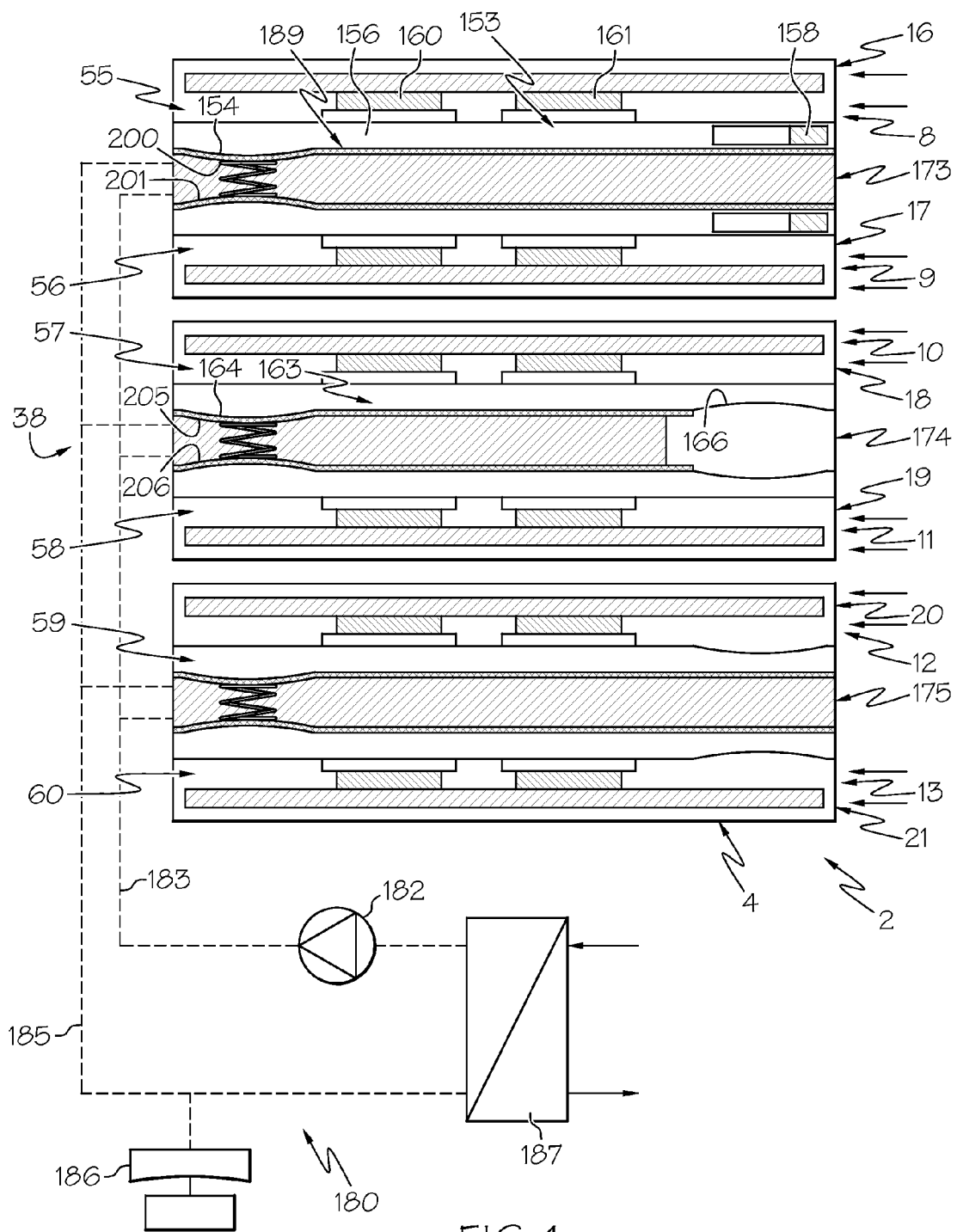
FIG. 1 is a cross-sectional side schematic view of an electronic component system cabinet including a cooling system constructed in accordance with an exemplary embodiment of the invention.

With initial reference to FIG. 1, an electronic component system cabinet constructed in accordance with exemplary embodiments of the invention is indicated generally at 2. Cabinet 2 includes a housing 4 having a plurality of electronic component system bays 8-13. Cabinet 2 is further shown to include a plurality of electronic component systems 16-21, shown in the form of blade servers, arranged within corresponding ones of electronic component system bays 8-13. As will be discussed more fully below cabinet 2 includes a cabinet or rack cooling system 38 that is non-fluidly connected to cooling systems provided in each blade server 16-21.

As shown, each blade server includes a corresponding cooling system 55-60. As each cooling system 55-56 is similarly formed, a detailed description will follow referencing cooling system 55, with an understanding that cooling system 56 is similarly constructed. In the exemplary embodiment shown, cooling system 55 includes a spreader plate 153 provided with a flexible membrane portion 154. Spreader plate 153 includes an internal fluid reservoir 156 as well as a compressed air reservoir 158. As will be discussed more fully below, coolant is situated within spreader plate 153. The coolant is circulated to carry away heat produced by electronic components such as shown at 160 and 161.

Reference will continue with FIG. 1 in describing cooling systems 57-60 in accordance with an exemplary embodiment of the invention. However, as each cooling system 57-60 is similarly formed, a detailed discussion will follow with respect to cooling system 57 with an understanding that the remaining cooling systems, i.e., cooling systems 58-60 are similarly constructed. As shown, cooling system 57 includes a spreader plate 163 provided with a first expansion or flexible membrane portion 164 and a second expansion or flexible membrane portion 166. As will be discussed more fully below, flexible membrane portions 164 and 166 act as a pump to circulate fluid within spreader plate 163.

In accordance with the exemplary embodiment shown, rack cooling system 38 includes a plurality of coolant reservoirs 173-175 fluidly connected to a centralized pumping system 180. Centralized pumping system 180 includes a pump 182 fluidly connected to each coolant reservoir 173-175 via a first conduit 183. A second conduit 185 leads back or returns to pump 182 via a pressure modulator 186 and a heat exchanger 187. Coolant reservoirs 173-175 are arranged between corresponding electronic component systems 16-21. A thermal interface member (TIM) 189 provides an interface between reservoir 173 and spreader plate 153. Of course, additional TIM's (not separately labeled) provide an interface between each coolant reservoir 173-175 and a corresponding one of cooling systems 56-60. In any event, as each coolant reservoir 173 and 175 are similarly formed, a detailed description will follow with respect to coolant reservoir 173 with an understanding that coolant reservoir 175 is similarly constructed.

As shown, coolant reservoir 173 includes a first flexible membrane 200 and a second flexible membrane 201. With this arrangement, pumping system 180 circulates a fluid within coolant reservoir 173. The coolant expands and contracts respective ones of flexible membranes 200 and 201 which act upon flexible membrane portion 154 on spreader plate 153 and an opposing flexible membrane portion (not separately labeled) associated with cooling system 56. The coolant pumped into coolant reservoir 173 causes flexible membrane 200 to expand into flexible membrane portion 154 on spreader plate 153. Expansion of flexible membrane portion 154 creates a pressure within spreader plate 153 that compresses air within compressed air reservoir 158. When pressure is relieved from coolant reservoir 173, the compressed air within reservoir 158 acts upon the coolant within spreader plate 153 and forces flexible membrane portion 154 into flexible membrane 200 creating an oscillating pumping action that is regulated by pressure modulator 186.

In the exemplary embodiment shown, coolant reservoir 174 is shortened relative to, for example, spreader plate 163. However, in a manner similar to that described above, coolant reservoir 174 includes a first flexible membrane 205 and a second flexible membrane 206. Coolant pumped into coolant reservoir 174 causes flexible membrane 205 to expand into flexible membrane portion 164 on spreader plate 163. Expansion of flexible membrane portion 164 creates a pressure within spreader plate 163 that causes flexible membrane portion 166 to expand. When pressure is relieved from coolant reservoir 174 via pressure modulator 186, flexible membrane portion 166 contracts forcing the coolant within spreader plate 163 to expand flexible membrane portion 164. The expansion of flexible membrane portion 164 acts upon flexible membrane 205 causing coolant to pass into pumping system 180 thereby creating an oscillating pumping action that is regulated by pressure modulator 186. In this manner, the coolant lowers temperatures for each electronic component system 16-21. Moreover, by maintaining rack cooling separate from component cooling, each electronic component system 16-21 can be readily removed and/or replaced (hot swapped) without opening any fluid connections or exposing electronic components to coolant.

Figure 2:
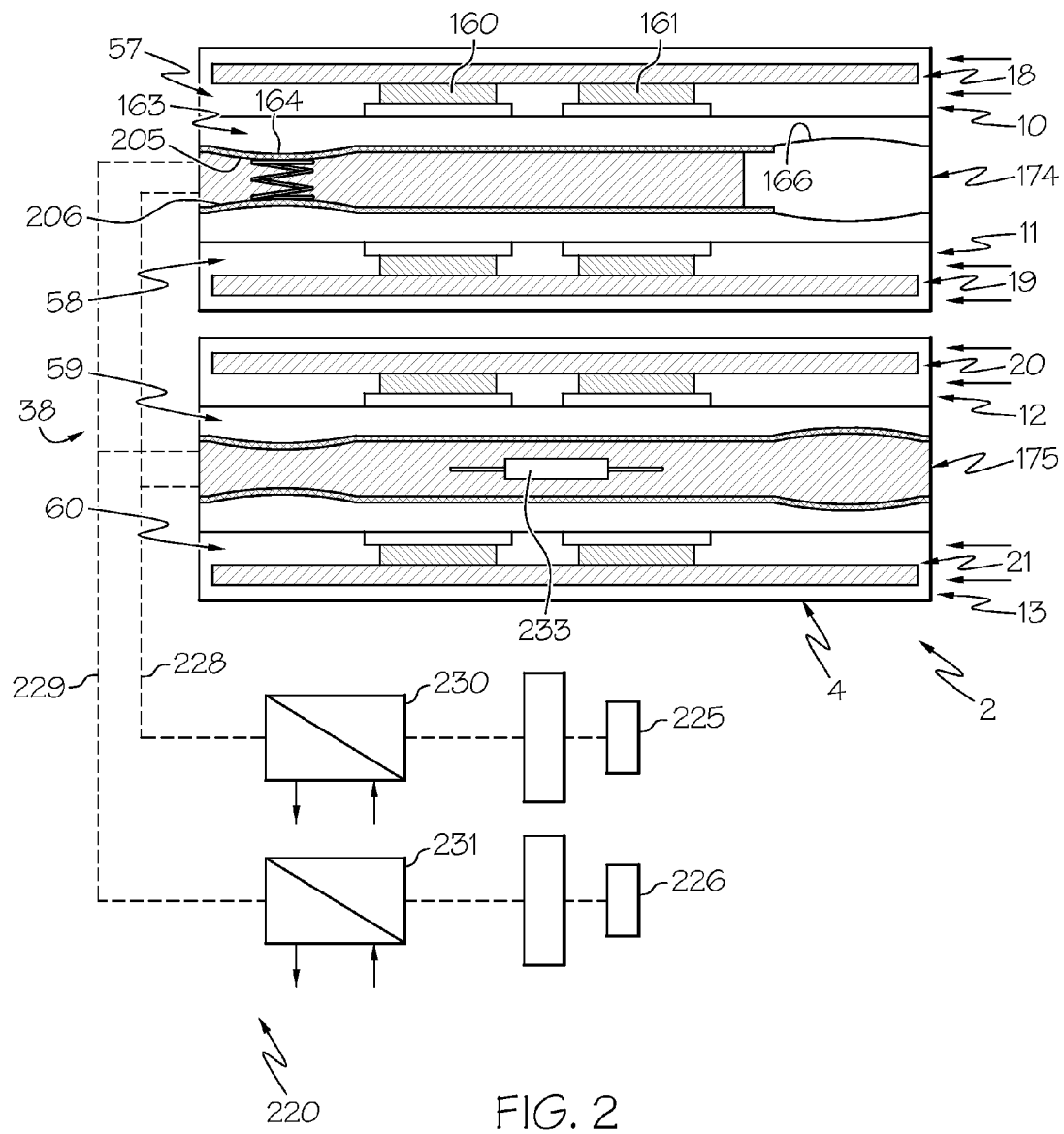
FIG. 2 is a cross-sectional side schematic view of an electronic component system cabinet including a cooling system constructed in accordance with another exemplary embodiments of the invention.

Reference will now be made to FIG. 2, wherein like reference numbers represent corresponding parts and their respective views, in describing a pumping system 220 constructed in accordance with another exemplary embodiment of the invention. As shown, pumping system 220 includes a first coolant pump 225 and a second coolant pump 226. Each coolant pump 225 and 226 is shown in the form of a displacement pump mechanism. In the exemplary embodiment shown, first coolant pump 225 is fluidly connected to each coolant reservoir 174 and 175 via a first conduit 228. A second conduit 229 fluidly connects second coolant pump 226 to each coolant reservoir 174 and 175. Each conduit 228, 229 is fluidly connected with each other via coolant reservoirs 174 and 175. In addition, each conduit 228, 229 is fluidly connected to an associated heat exchange member 230 and 231. With this arrangement, fluid or coolant is pumped through pumping system 220 in an oscillating mode by displacement of first and second coolant pumps 225 and 226. The oscillating operation creates a time varying system pressure that drives corresponding spreader plate membranes 164, 166 and induces fluid flow within spreader plate 163. In this manner, coolant is pumped in a push pull mode through each coolant reservoir 174 and 175. In order to further facilitate the push pull mode, a fluid resistance member, such as indicated at 233 implemented in coolant reservoir 175, is connected to pumping system 220 to enhance system flow parameters.

Figure 3:
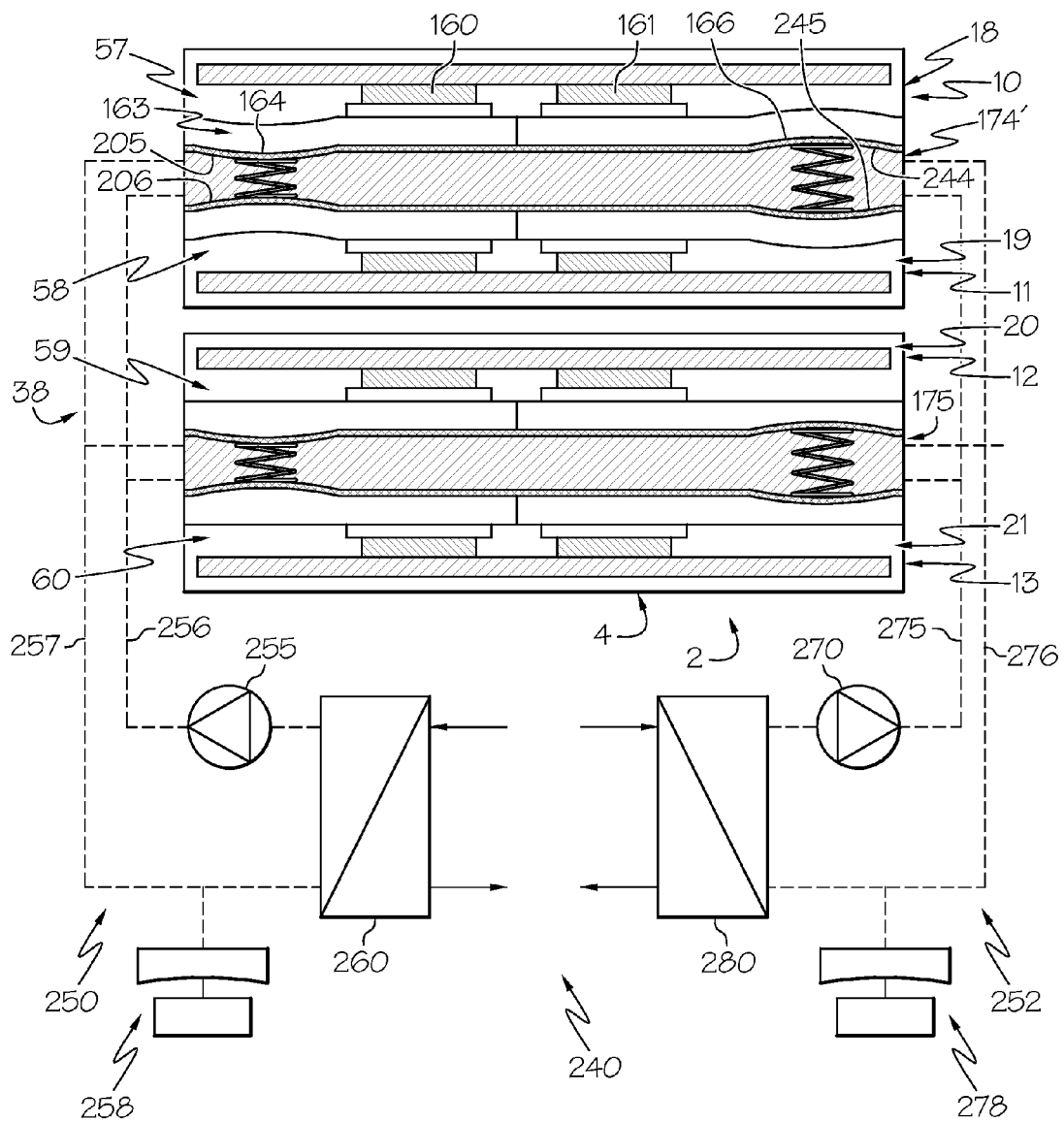
FIG. 3 is a cross-sectional side schematic view of an electronic component system cabinet including a cooling system constructed in accordance with still another exemplary embodiment of the invention.

Reference will now be made to FIG. 3, wherein like reference numbers represent corresponding parts in their respective views, in describing a pumping system 240 constructed in accordance with yet another exemplary embodiment of the invention. In the exemplary embodiment shown, cooling system 57 includes a coolant reservoir 174' that extends a full depth of cabinet 2 and not only includes first and second flexible membranes 205 and 206, but also third and fourth flexible membranes 244 and 245 that further enhance fluid movement within spreader plate 163. With this construction, pumping system 240 includes a first coolant loop 250 and a second coolant loop 252. First coolant loop 250 includes a first coolant pump 255 operatively connected to coolant reservoirs 174' and 175 via a first conduit 256. A second conduit 257 carries coolant from coolant reservoirs 174' and 175 back through coolant loop 250 via a pressure modulator 258 and a heat exchange member 260 before returning the coolant to pump 255. Similarly, second coolant loop 252 includes a second coolant pump 270 that is fluidly connected to coolant reservoirs 174' and 175 via a first conduit 275. Coolant flows back through a second conduit 276 via a pressure modulator 278 and a heat exchange member 280 before returning to second coolant pump 270. With this arrangement, each coolant loop 250, 253 is operated with a phase shift of 90 degrees to realize a radial oscillatory fluid flow in spreader plate 163.

Figure 4:
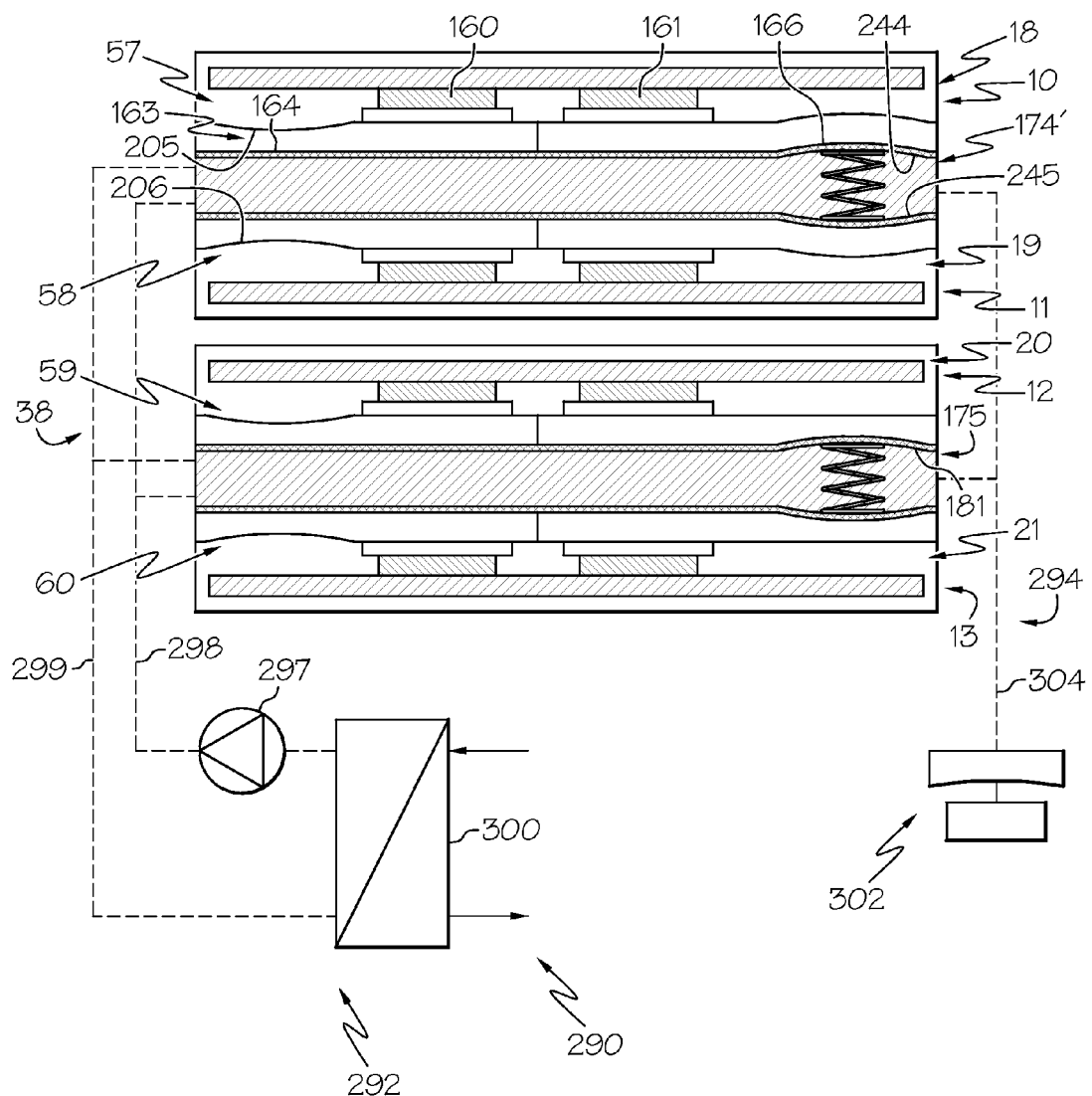
FIG. 4 is a cross-sectional side schematic view of an electronic component system cabinet including a cooling system constructed in accordance with a further exemplary embodiment of the invention.

Reference will now be made to FIG. 4, wherein like reference numbers represent corresponding parts in the respective views, in describing a pumping system 290 constructed in accordance with yet another exemplary embodiment of the invention. As shown, pumping system 290 includes a cooling loop 292 and an actuation system 294. Cooling loop 292 includes a coolant pump 297, operatively connected to each coolant reservoir 174' and 175 via a first conduit 298. Cooling loop 292 also includes a second conduit 299 that carries coolant from each coolant reservoir 174' and 175, through a heat exchange member 300 and back to coolant pump 297. Actuation system 294 includes a pressure modulator 302 fluidly connected to each coolant reservoir 174' and 175 via a conduit 304. With this arrangement, coolant loop 290 controls a flow of coolant through each coolant reservoir 174' and 175 while actuation system 294 controls a pressure that controls, for example, flexible membrane portions 205, 206 and 244, 245 of coolant reservoir 174'. In this configuration, coolant pump 297 controls coolant flow into reservoirs 174' and 175 and actuation system 294 controls coolant flow within, for example, spreader plate 163.

Figure 5:
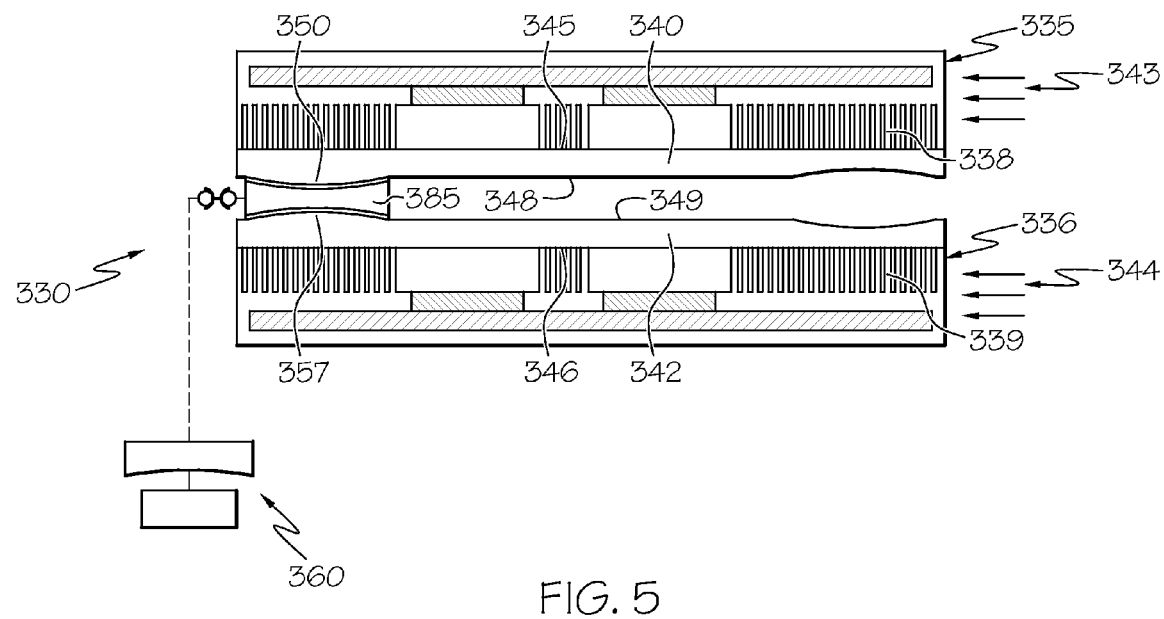
FIG. 5 is a cross-sectional side schematic view of an electronic component system cabinet including a cooling system constructed in accordance with a still further exemplary embodiment of the invention.
Figure 6:
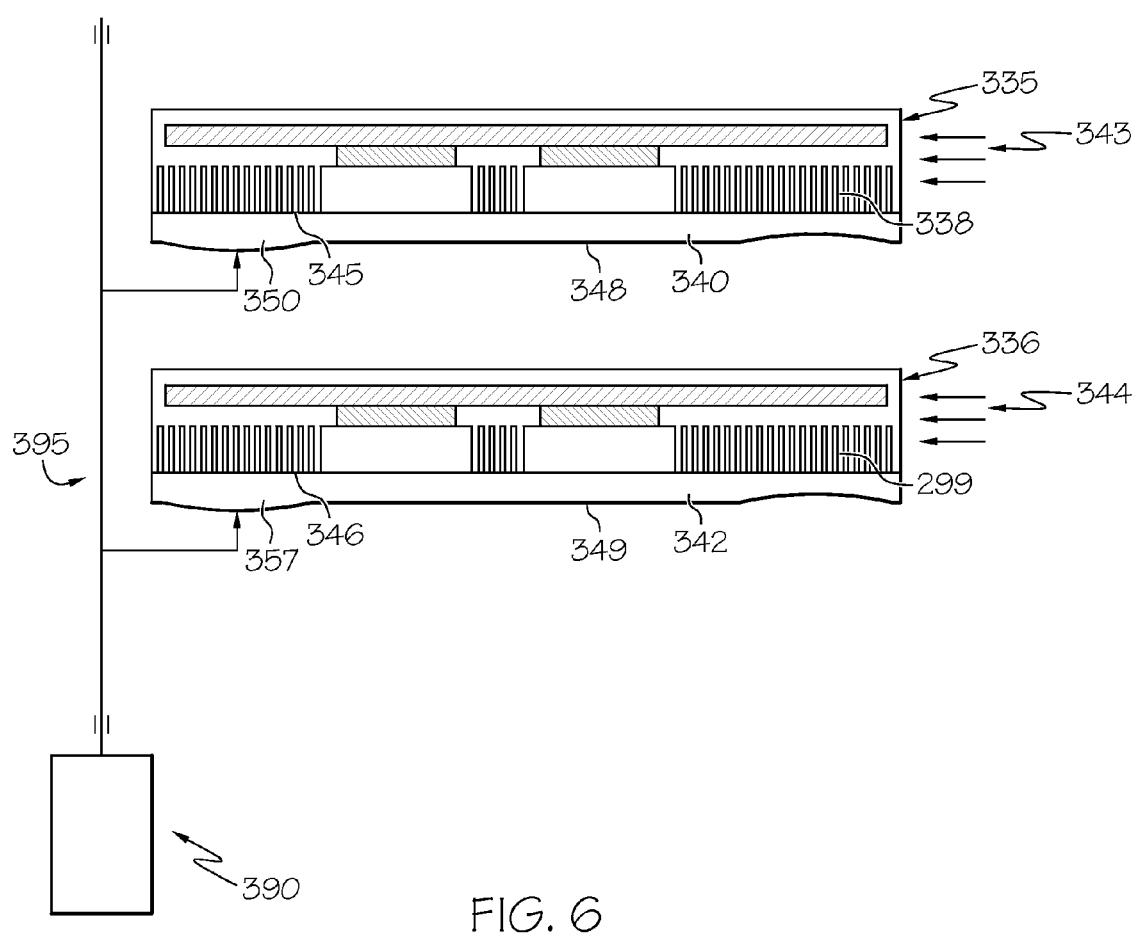
FIG. 6 is a cross-sectional side schematic view of an electronic component system cabinet including a cooling system constructed in accordance with exemplary embodiments of the invention.

Reference will now be made to FIG. 5 in describing a cabinet cooling system 330 in accordance with still another exemplary embodiment of the invention. Cabinet cooling system 330 is shown associated with a first electronic component system 335 and a second electronic component system 336. Cooling system 330, in contrast to the previously described cooling system which employs a liquid coolant to operate the membranes, utilizes only air as a cooling and pressure modulation medium and thus may include a quick connects (not separately labeled). Towards that end, each electronic system component 335 and 336 includes an associated plurality of fins 338 and 339 mounted to a corresponding spreader plate 340, 342. The heat from the fins is removed by an air flow 343 and 344 induced by rack level fans (not shown). Each spreader plate 340, 342 includes a corresponding first surface 345, 346 and an opposing second surface 348, 349. As shown, each spreader plate 340 and 342 also includes an associated flexible membrane portion 350 and 357. Flexible membranes portions 350 and 357, when activated, create a fluid flow within each spreader plate 340 and 342. The fluid passing through spreader plates 340 and 342 exchanges heat with fins 338 and 339 as well as other heat exchange components (not separately labeled) located within each electronic component system 335 and 336. With this arrangement, a coolant pump 360 shown in the form of an air pressure modulator, distributes air to a coolant reservoir or pressure chamber 385. The air expands and contracts against flexible membrane portions 350 and 357 of each spreader plate 340 and 342. As noted above, the expansion and contraction of flexible membranes 350 and 357 creates a flow of fluid that absorbs heat contained within electronic component systems 335 and 336. At this point, it should be realized that coolant pump 360 can take the form of a linear actuator 390 operatively connected to each spreader plate 350, 357 via a linkage system 395 such as shown in FIG. 6. In this manner, linear actuator 390 moves linkage system 395 to create pulsations within flexible membrane portions 350 and 357 causing a fluid flow or circulation within each spreader plate 340 and 342.

Figure 7:
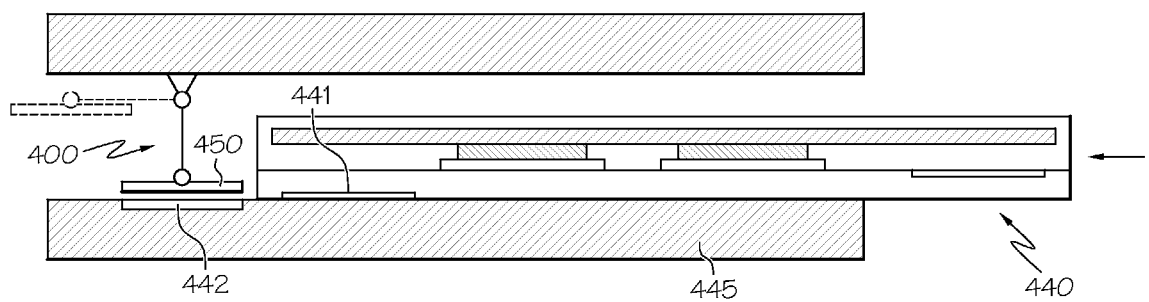
FIG. 7 is a cross-sectional side schematic view of an immobilization system employed when an electronic component is removed from an electronic component system cabinet in accordance with an exemplary embodiment of the invention.

FIG. 7 illustrates a membrane immobilization system 400. In accordance with the embodiment shown, a blade server 440 includes a flexible membrane portion 441. Flexible membrane portion 441 is configured to interact with a flexible membrane 442 provided on a coolant reservoir 445 when blade server 440 is installed. However, when blade server 440 is removed, flexible membrane 442 must be constrained to ensure proper operation. Towards that end, immobilization system 400 includes a blocking member 450 that is pivotal between a first position when an electronic component system 440 is inserted into a corresponding electronic component system bay and a second or membrane constraining position when electronic component system 440 is removed. In the second position, blocking member 450 abuts flexible membrane 442. In this manner, electronic component systems can be readily removed and replaced (hot swapped) from cabinet 2 without creating any adverse effects or loss of efficiency within the associated cabinet cooling system.

At this point, it should be realized that the exemplary embodiments of the present invention provide electronic component system cabinet including a cabinet cooling system that is decoupled from a corresponding electronic component cooling system. By decoupling the cabinet cooling systems and the component cooling systems, components can be readily removed and replaced (hot swapped) into an electronic component system cabinet without fear that coolant will leak onto operating electronic components. Moreover, by decoupling the cabinet cooling system from the component cooling system, the need for quick disconnect, or other associated hardware is eliminated. Furthermore, the present invention utilizes significantly less fluid than corresponding liquid cooling systems and thus risks associated with flooding are significantly reduced.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. An electronic component system cabinet comprising:
   a housing including a plurality of electronic component system bays;
   an electronic component system mounted in one of the plurality of electronic component system bays, the electronic component system including at least one heat producing component and a cooling system operatively connected to the at least one heat producing component, the cooling system including spreader plate having a first surface arranged in a heat exchange relationship with the at least one heat producing component and a second surface including a flexible membrane portion, the spreader plate including a fluid; and
   a cabinet cooling system including:

at least one coolant reservoir containing a coolant, the at least one coolant reservoir including a flexible membrane arranged in non-fluid contact with the flexible membrane portion of the spreader plate; and a centralized pumping system including at least one pump fluidly connected to the at least one coolant reservoir, the at least one pump being selectively operated to circulate a flow of coolant to the at least one coolant reservoir, the flow of coolant expanding and contracting the flexible membrane causing the fluid to flow within the spreader plate to absorb heat produced by the at least one heat producing component, wherein the at least one pump comprises a linear actuator operatively connected to the spreader plate through a linkage system, the linear actuator being selectively operated to pulsate the flexible membrane portion to create a coolant flow within the spreader plate.

2. The electronic component system cabinet according to claim 1, further comprising: a thermal interface member extending between the at least one coolant reservoir and the spreader plate.

3. The electronic component system cabinet according to claim 1, further comprising: a pressure modulator fluidly connected to the at least one pump.

4. The electronic component system cabinet according to claim 1, wherein cabinet cooling system includes a plurality of coolant reservoirs, each of the plurality of coolant reservoirs being associated with two of the plurality of electronic component system bays.

5. The electronic component system cabinet according to claim 4, wherein the at least one pump includes a first pump fluidly connected to the plurality of coolant reservoirs and a second pump fluidly connected to the plurality of coolant reservoirs.

6. The electronic component system cabinet according to claim 5, wherein the first pump urges coolant into each of the plurality of coolant reservoirs and the second pump draws coolant out from each of the plurality of coolant reservoirs.

7. The electronic component system cabinet according to claim 5, wherein the first pump defines a first coolant loop and the second pump defines a second coolant loop, the second coolant loop being distinct from the first coolant loop.

8. The electronic component system cabinet according to claim 1, wherein the pumping system includes a heat exchanger fluidly connected to the at least one pump, the heat exchanger removing heat from the coolant captured from the electronic component system.

9. The electronic component system cabinet according to claim 1, wherein the pumping system includes a cooling loop and an actuation system, the cooling loop directing coolant into the at least one coolant reservoir and the actuation system creating a pressure modulation that causes the flexible membrane to expand and contract.

10. The electronic component system cabinet according to claim 1, wherein the at least one coolant reservoir comprises a pressure chamber that acts upon the flexible membrane portion of the spreader plate.

* * * * *